United States Patent [19]

Cory

[11] Patent Number: 5,327,085

[45] Date of Patent: Jul. 5, 1994

[54] METHOD FOR INCREASING RESOLUTION IN A NMR SOLIDS IMAGING SYSTEM

[75] Inventor: David G. Cory, Boston, Mass.

[73] Assignee: Bruker Instruments, Inc., Billerica, Mass.

[21] Appl. No.: 642,397

[22] Filed: Jan. 17, 1991

[51] Int. Cl.$^5$ ............................................. G01V 3/00
[52] U.S. Cl. .................................... 324/307; 324/309
[58] Field of Search .............. 324/307, 309, 311, 312, 324/314

[56] References Cited

U.S. PATENT DOCUMENTS

| | | | |
|---|---|---|---|
| 3,474,329 | 10/1969 | Waugh | 324/311 |
| 3,530,373 | 9/1970 | Waugh | 324/311 |
| 3,530,374 | 9/1970 | Haeberlen et al. | 324/311 |
| 3,781,650 | 12/1973 | Keller | 324/311 |
| 4,443,761 | 4/1984 | Levitt | 324/311 |
| 4,470,014 | 9/1984 | Levitt et al. | 324/311 |
| 4,486,709 | 12/1984 | Bendall | 324/314 |
| 4,510,449 | 4/1985 | Ernst et al. | 324/309 |
| 4,521,732 | 6/1985 | Pegg et al. | 324/300 |
| 4,682,107 | 7/1987 | Bendall et al. | 324/307 |

FOREIGN PATENT DOCUMENTS

WO91/00529  1/1991  PCT Int'l Appl.

OTHER PUBLICATIONS

Low-Power Multipulse Line Narrowing in Solid-State NMR, Burum et al. Journal. Mag. Res. No. 44 (1981) pp. 173-188.

$^1$H-Refocused Gradient Imaging of Solids, J. B. Miller & A. N. Garroway Journal of Magnetic Resonance pp. 529-538 No. 82 (1989).

Frequency-Switched Pulse Sequences: Homonuclear Decoupling and Dilute Spin NMR in Solids, Bielecki et al, Chem. Phys. Letters Mar. 1989 vol. 155 No. 4,5.

Heteronuclear Correlation Spectroscopy in Rotating Solids, Caravatti et al. Chem. Phys. Letters, Jul. 1982 vol. 89 No. 5 pp. 363-366.

Two-Dimensional Heteronuclear Chemical Shift Correlation Spectroscopy in Rotating Solids, Roberts et al. Amer. Chem. Soc. (1984) vol. 106, No. 9 pp. 2506-2512.

"Pulsed Field Gradient NMR Imaging of Solids", J. B. Miller, D. G. Cory and A. N. Garroway, Chemical Physics Letters, vol. 164, No. 1, pp. 1-4 (1989).

Miller et al., *H-Refocused Gradient Imaging of Solids*, Journal of Magnetic Resonance, May, (1989) No. 3, pp. 529-538.

Cory et al., *Time-Suspension Multiple-Pulse Sequences: Applications to Solid-State Imaging*, Journal of Magnetic Resonance, Oct. 15, 1990.

Cory et al., *DANTE Slice Selection for Solid-State NMR Imaging*, Journal of Magnetic Resonance, Dec. 1990 pp. 544-550.

Fujiwara et al., *Composite Inversion Pulses with Frequency Switching and Their Applications to Broadband Decoupling*, Journal of Magnet Resonance, Mar., 1988 pp. 53-254.

Levitt et al., *Composite Pulses Constructed by a Recursive Expansion Procedure*, Journal of Magnetic Resonance, 1983, pp. 247-254.

Munowitz, *Approaches to High-Resolution 1H NMR in Solids*, Trends in Analytical Chemistry, pp. 256-258.

Trac, Trends in Analytical Chemistry, vol. 9, No. 8, Sep. 2, 1990, Cambridge GB pp. 253-263.

*Primary Examiner*—Louis Arana
*Attorney, Agent, or Firm*—Wolf, Greenfield & Sacks

[57] ABSTRACT

A multiple-pulse RF pulse sequence applied to abundant nuclei after excitation and in the presence of a spatial magnetic field gradient significantly reduces the resonant line width thereby increasing image resolution relative to other known pulse sequences. The RF pulse sequence is constructed from selected sets of known six-pulse cycles called dipolar decoupled inversion pulses. The dipolar decoupled inversion pulses are, in turn, constructed from standard solid echo pulse pairs. The magnetic field gradient is periodically varied during application of the RF pulses to preserve imaging information.

20 Claims, 3 Drawing Sheets

METHOD FOR INCREASING RESOLUTION IN A NMR SOLIDS IMAGING SYSTEM

FIELD OF THE INVENTION

This invention relates to imaging of solids produced by NMR imaging abundant nuclei and, in particular, to radio-frequency pulse sequences for improving the resolution of solid NMR images by suppressing homonuclear dipolar coupling and time-independent linear $I_z$ interactions.

BACKGROUND OF THE INVENTION

Nuclear magnetic resonance (NMR) is a phenomenon exhibited by a select group of atomic nuclei and is based upon the existence of nuclear magnetic moments in these nuclei (termed "NMR active" nuclei). When an NMR active nucleus is placed in a strong, uniform and steady magnetic field, it processes at a natural resonance frequency known as a Larmor frequency, which is characteristic of each nuclear type and is proportional to the applied field strength in the location of the nucleus. Typical NMR active nuclei include $^1H$ (protons), $^{13}C$, $^{19}F$ and $^{31}P$. The resonant frequencies of the nuclei can be observed by monitoring with an RF receiver the transverse magnetization which results after a strong RF pulse. It is common practice to convert the measured signal to a frequency spectrum by means of Fourier transformation.

In order to use the NMR phenomenon to obtain an image of a sample, a magnetic field is applied to the sample, along with a magnetic field gradient which depends on physical position so that the field strength at different sample locations differs. When a field gradient is introduced, as previously mentioned, since the Larmor frequency for a particular nuclear type is proportional to the applied field, the Larmor frequencies of the same nuclear type will vary across the sample and the frequency variance will depend on physical position. By suitably shaping the applied magnetic field and processing the resulting NMR signals for a single nuclear type, a nuclear spin density image of the sample can be developed. Because the NMR signal which is developed is a function of the total number of nuclei of a given type, it is common to use a nucleus which is found in abundance in the sample to be imaged. For example, $^1H$ (protons) are commonly used because they are abundant in many materials and therefore, generate a large NMR signal.

The Larmor frequency for a given nuclear type is not exactly proportional to the applied magnetic field, since other interactions can also affect the Larmor frequency. A complex spectrum of frequencies is typically observed in the absence of a magnetic field gradient. Because the Larmor frequency dependence on nuclear position is the basis for forming an image, in order to resolve two spatially-distinct but physically-adjacent elements, the magnetic field gradient strength must be increased to a point where the resonance frequency of nuclei in each element are shifted from each by an amount which is greater than the natural spread in resonance frequencies.

Aside from a practical limit on magnetic field gradient strength which can be generated with existing equipment, increasing the gradient strength also broadens the total spread of resonant frequencies over the entire sample width. As all of these frequencies must be accommodated by the RF receiver, the bandwidth of the receiver must also be increased. Noise enters the receiver in proportion to the square-root of the receiver bandwidth so that as the magnetic gradient strength increases, additional redundant measurements must be taken to extract the signal from the noise. Since the redundant measurements require extra time, the amount of time needed to acquire an image therefore also places a practical limit on the image resolution. Consequently, most prior art techniques for increasing image resolution have attempted to reduce the resonance line width as much as possible rather than increasing the magnetic field gradient.

The natural resonance line width in a sample is generally most influenced by three factors: dipolar couplings, chemical shifts and susceptibility broadening. The most serious of these broadening factors is the dipolar coupling. More particularly, the magnetic moments in neighboring nuclei perturb each other, resulting in interactions called dipole-dipole couplings. If the neighboring nuclei are of the same type, the perturbations are called homonuclear dipolar couplings and tend to broaden the characteristic resonance lines and reduce image resolution. In liquids, the field perturbations induced by dipolar couplings are time-averaged to zero and thus do not severely affect image resolution, but in solids, these couplings can give rise to very large static magnetic field components which can be as much as several Gauss for interacting protons. A field perturbation of this magnitude can significantly widen a resonance peak and reduce image resolution.

Chemical shifts are also an important source of line broadening. More particularly, although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field result in slight spectral shifts in the Larmor frequencies between two such chemically non-equivalent nuclei, called "chemical shifts" which tend to broaden the resonance peaks and reduce image resolution.

The chemical shifts have a component which is anisotropic in that it depends on the particular orientation of a molecule to the applied Zeeman field and an isotropic part which is independent of the applied field direction. In liquids, the rapid molecular motion tends to average out the anisotropic parts of the chemical shifts leaving relatively small isotropic parts. However, in solids, the orientation of the solid molecules is relatively fixed with respect to the applied Zeeman field and, accordingly, the anisotropic chemical shift components do not average to zero, resulting in a much more severe peak broadening problem.

Susceptibility broadening occurs because an assumption is made that magnetic susceptibility of the nuclei is the same across the entire sample and that the applied magnetic field gradient is constant across the entire sample. This is practically not true in either case and each sample and applied field will have inhomogeneous areas which give rise to additional broadenings.

Therefore, in solids imaging systems, it is important to suppress homonuclear dipolar couplings, chemical shifts and susceptibility broadenings (chemical shifts and susceptibility broadenings are referred to collectively as "inhomogeneous" broadenings) in order to obtain high resolution without increasing the magnetic field gradient. One prior art method of reducing some of the aforementioned broadenings consists of orienting the solid sample at the "magic angle" (54° 44') with respect to the applied Zeeman field and physically rotating the solid at a relatively rapid rate thereby causing the perturbing components to average to zero and to greatly reduce the resulting perturbations. This technique is called "magic angle sample spinning" or MASS. In this case, the magnetic field gradient must also rotate in synchronism with the rotating sample.

Other prior art techniques take advantage of the fact that, since the orientation of the sample molecules with respect to the applied field is relatively fixed in a solid, after an initial excitation, the nuclear spins change or evolve in time in known ways (which can be described mathematically by means of a mathematical operator known as a "Hamiltonian" operator that depends on various factors including the dipolar coupling, chemical shift and susceptibility factors). Although the nuclear evolution produced by the field gradient and inhomogeneous perturbations have the same spin dependence, the inhomogeneous perturbations are time independent. Therefore, it is possible to differentiate the two types of interactions by making the magnetic field gradient strength time-dependent. Accordingly, some conventional imaging schemes use pulsed gradients or oscillating gradients. Still other prior art two-dimensional imaging schemes step the gradient strength in a controlled fashion between successive data points.

Further known techniques take advantage of the fact that the evolution caused by inhomogeneous perturbations is time-independent. These latter techniques involve irradiating the sample nuclei with selected radio-frequency (RF) pulses at, or near, the Larmor frequency. The various orientations and phases of the RF pulses are selected to periodically reverse the nuclear evolution due to dipolar, chemical shift and susceptibility factors (including any inhomogeneity in the applied static field) in order to effectively average out the spin interactions over time so that their contribution to the final output is greatly diminished. As this periodic reversal would also average and destroy imaging information if the gradient was time independent, the imaging information is reintroduced by making the amplitude of the magnetic field gradient time dependent so that, over time, the nuclear spin evolution resulting from the undesired factors averages to zero, but the nuclear spin evolution due to the magnetic field gradient does not average to zero. The result is that the Larmor resonance line is effectively "narrowed" in frequency, thereby increasing image resolution. An example of this latter technique is discussed in detail in "$^1$H-Refocussed Gradient Imaging of Solids", J. B. Miller and A. N. Garroway, *Journal of Magnetic Resonance*, v. 82, pp. 529–538.

In other known techniques, this latter pulsing technique is combined with the aforementioned sample spinning in a technique called CRAMPS (Combined Rotation And Multiple Pulse Spectroscopy).

Although the aforementioned RF pulse sequences are effective in narrowing the resonance lines, in practice, they are difficult to implement since they generally require special instrumentation and a high degree of technical skill. In particular, the methods are highly susceptible to interference due to inhomogeneous RF fields, pulse imperfections and transmitter misadjustments. Consequently, very precise and sophisticated NMR instruments must be used and great care must be taken to properly adjust the instruments during use. The result is that a large amount of time is necessary to construct even simple images.

Accordingly, it is an object of the present invention to provide a method for increasing the resolution of an NMR solids imaging system.

It is another object of the present invention to provide a method for increasing the resolution of an NMR solids imaging system which does not require special instrumentation or experimental skills.

It is yet another object of the present invention to provide a method for increasing the resolution of an NMR solids imaging system which is tolerant of RF field inhomogeneity, pulse imperfections, and transmitter misalignment.

It is still another object of the present invention to provide a method for increasing the resolution of an NMR solids imaging system by narrowing the resonance line width.

It is a further object of the present invention to provide a method for increasing the resolution of an NMR solids imaging system which increases resolution by utilizing a line-narrowing multiple-pulse RF pulse sequence.

It is yet a further object of the present invention to provide a method for increasing the resolution of an NMR solids imaging system in which a multiple-pulse RF pulse sequence time averages to zero the nuclear evolution due to homonuclear dipolar couplings as well as time independent inhomogeneous broadenings.

SUMMARY OF THE INVENTION

The foregoing problems are solved and the foregoing objects are achieved in one illustrative embodiment of the invention in which a multiple-pulse RF pulse sequence significantly reduces the resonant line width relative to other known pulse sequences. Further, the inventive pulse sequence is relatively insensitive to inhomogeneous RF fields, pulse imperfections and transmitter misadjustments so that it can be used on less sophisticated instruments and does not require long setup times. The magnetic field strength gradient oscillates with a period equal to the cycle time of the multiple RF pulse sequence so that gradient-induced spin evolution is maintained.

More particularly, the inventive RF pulse sequence is constructed from selected sets of known six-pulse cycles called dipolar decoupled inversion pulses or composite inversion pulses. The composite inversion pulses are, in turn, constructed from standard solid echo pulse pairs.

In one illustrative embodiment, a 48 pulse sequence comprised of eight composite inversion pulses is used with a magnetic field gradient which is sinusoidally time dependent such that the period of the sinusoidal gradient is equal to the 48 pulse sequence time duration. With this combination, a stepped RF phase shift is introduced which produces a spatially homogeneous offset of the resulting image. In one illustrative experiment, the output magnetization is sampled once at the end of the pulse/gradient cycle and the experiment is repeated to map out the accumulated phase evolution induced by a combination of the gradient and phase offset.

DETAILED DESCRIPTION OF THE PREFERRED EMBODIMENTS

Figure 1:
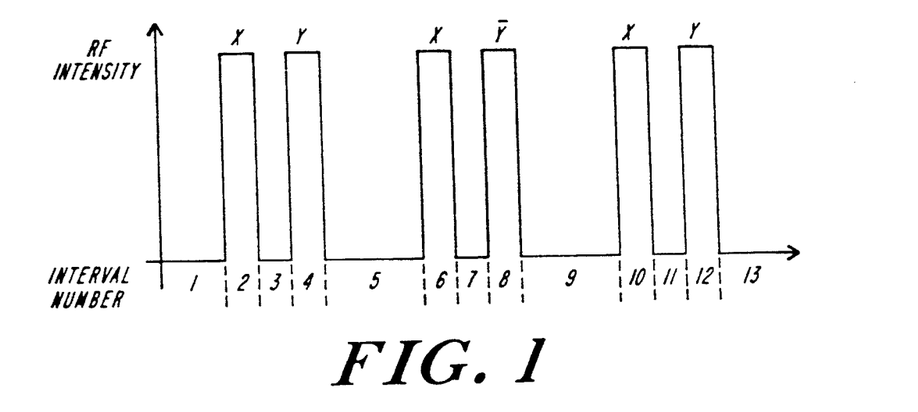
FIG. 1, is a schematic illustration of a known six-pulse dipolar decoupled inversion pulse with the various time intervals denoted.

FIG. 1 shows an example of a known six-pulse composite inversion pulse which comprises the basic building block of the inventive pulse sequence. Composite pulses and their characteristics are known in the art and are described in more detail, for example, in "Time suspension Multiple Pulse Sequences: Application to Solid State Imaging", D. G. Cory, J. B. Miller and A. N. Garroway, *Journal of Magnetic Resonance*, v. 90, p. 205 (1990), which article is hereby incorporated by reference.

The six-pulse sequence is made of thirteen time intervals numbered illustratively as intervals 1-13. There are three pulse pairs with each pulse having a time duration of $\alpha$ which comprise time intervals 2, 4, 6, 8, 10 and 12. A time delay of $\tau$ between pulses comprises time intervals 3, 7, and 11. In a standard solid echo pulse pair this delay is set at one-half of the time intervals between pulse pairs (time intervals 1, 5, 9 and 13); however, as described below, the characteristics of the inventive sequence are largely maintained even if the sequence is run "semi-windowless" (with $\tau$ set to zero).

As previously mentioned, after an initial excitation, the nuclear spins change or evolve in time in known ways which can be described mathematically by means of a mathematical operator known as the Hamiltonian operator. The overall Hamiltonian can be considered as the sum of the Hamiltonian operators each of which results from separate perturbations such as dipolar coupling, chemical shifts, susceptibility and field gradient. Consequently, the effect of the six-pulse sequence on homonuclear dipolar coupling can be determined by examining the Hamiltonian operator describing homonuclear dipolar spin coupling for the inversion pulse.

Because the effects of a multiple pulse sequence on a Hamiltonian operator are quite complex, it is advantageous to apply a simplification known as average Hamiltonian theory. Average Hamiltonian theory is a known simplification which is described in more detail in an article by U. Haeberlen and J. S. Waugh, *Physical Review*, v. 175, p. 453 (1968); "Advances in Magnetic Resonance", U. Haeberlen, v. 12, suppl. 1, edited by J. S. Waugh, Academic Press (1982) and "Transient Techniques in NMR of Solids", B. C. Getstein and C. R. Dybowski, Academic Press (1985), which article and references are hereby incorporated by reference.

More particularly, if a Hamiltonian is assumed to be piecewise constant and periodic, average Hamiltonian theory takes on a particularly simple form in which a propagator is defined as $$U(\tau_c) = exp(-iH_n t_n) exp(-iH_{n-1} t_{n-1}) \cdots exp(-iH_1 t_1), \quad (1)$$

where $H_n$ is the active Hamiltonian during the nth time interval. Average Hamiltonian Theory allows the products in Eq. (1) to be replaced with a simple propagator of the form $$U(\tau_c) = exp(-i\bar{H}(\tau_c)\tau_c). \quad (2)$$

Where $\bar{H}(\tau_c)$ is the average Hamiltonian. The average Hamiltonian may be obtained directly by means of a conventional mathematical expansion known as the "Magnus expansion". The average Hamiltonian as given by the Magnus expansion is:

$$\bar{H}(\tau_c) = \bar{H}^{(0)} + \bar{H}^{(1)} + \bar{H}^{(2)} + \ldots \quad (3)$$

where the first two ("zero-order" and "first-order") terms are given by:

$$\bar{H}^{(0)} = \frac{1}{\tau_c} \{H_1 t_1 + H_2 t_2 + \ldots + H_n t_n\}, \quad (4)$$

and $$\bar{H}^{(1)} = - \quad (5)$$

$$\frac{1}{2\tau_c} \{[H_2 t_2, H_1 t_1] + [H_3 t_3, H_1 t_1] + [H_3 t_3, H_2 t_2] + \ldots \}.$$

Higher order terms have similar form. Consequently, the average Hamiltonian can be calculated by calculating the Hamiltonians and their products for each time interval and summing the results.

In high magnetic fields, the truncated form of the homonuclear dipolar Hamiltonian is:

$$\bar{H}_D^{(0)} = \sum_{i<j} \sum_j b_{i,j}(I_i \cdot I_j - 3I_{zi}I_{zj}) \quad (6)$$

where $$b_{i,j} = \frac{\gamma^2 \hbar^2}{8\pi^2 r_{i,j}^3} (3\cos^2\theta_{i,j} - 1). (7)$$

Thus, for the calculation of the dipolar Hamiltonian, it is sufficient to examine terms of the form $I_z I'_z$ integrated over each time interval, where $I_z$ is the $I_z$ operator in the toggling reference frame. Multi-column Table I shows the interval number (column one); time duration (column 2); the $I_z$ term (column three), the $I_z$ term integrated over the time interval (column four) and the $I_z I'_z$ term (column five) for each pulse in the 13 time intervals denoted in FIG. 1. With respect to Table I it is assumed that each pulse has a duration of α and that the short time delay between pulses is τ in the delta function RF pulse limit. $I_z$ terms are included in Columns 3 and 4 for the calculation of the chemical shift and susceptibility Hamiltonians in the following section.

With regard to the $I_zI'_z$ terms, an examination of Table I, column 5, indicates the following:

(a) all terms containing the expression cosθsinθ cancel.

(b) all terms containing the expression $\cos^2\theta$ have a corresponding term which contains the expression $\sin^2\theta$ so that when these terms are integrated over the appropriate time interval they may be rewritten as follows:

$$I_iI_j \int_0^a (\cos^2\theta + \sin^2\theta)dt = I_iI_j \int_0^a dt = I_iI_j a.$$

Consequently, for this pulse sequence, the zero-order dipolar Hamiltonian term ($H_D^{(0)}$) has the form:

$$\Sigma \int I_z I'_z dt' = 3\tau[I_xI'_x + I_yI'_y + I_zI'_z] \quad (8)$$

Comparing the result in equation (8) with the truncated dipolar Hamiltonian in equation (6) it can be seen that the term ($I_i \cdot I_j - 3I_{zi}I_{zj}$) in equation (6) becomes zero for this pulse sequence which implies that, for the six pulse sequence, the zero-order dipolar Hamiltonian is equal to zero, including the effects of finite pulses.

X, Y, −X, Y, X, Y, −Y, −X, −Y, X, −Y, −X, −X,
Y, −X, −Y, −X, Y, −Y, X, Y, X, −Y, X, −X, −Y,
X, −Y, −X, −Y, Y, X, Y, −X, Y, X, X, −Y, X, Y, X,
−Y, Y, −X, −Y, −X, Y, −X

In addition, although the pulses of each pulse pair are shown as occurring sequentially without an intervening time interval, in actuality, there will generally be a short interval of time between pulses (designated as τ in the above equations).

Figure 2A:
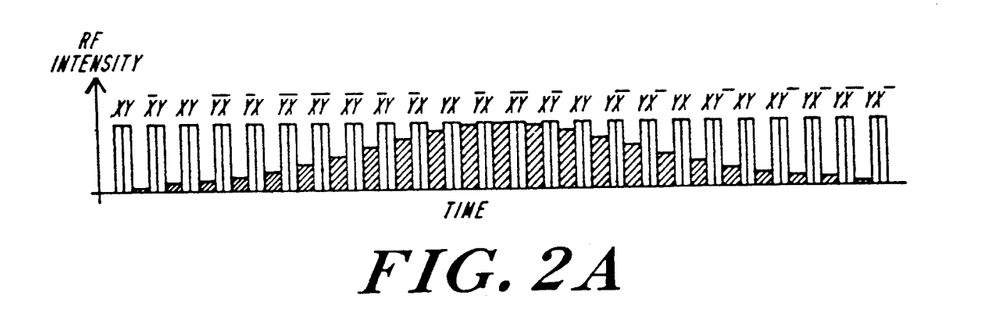
FIG. 2A is a schematic illustration of an illustrative 48 pulse multiple RF pulse sequence constructed in accordance with the principles of the invention.
Figure 2B:
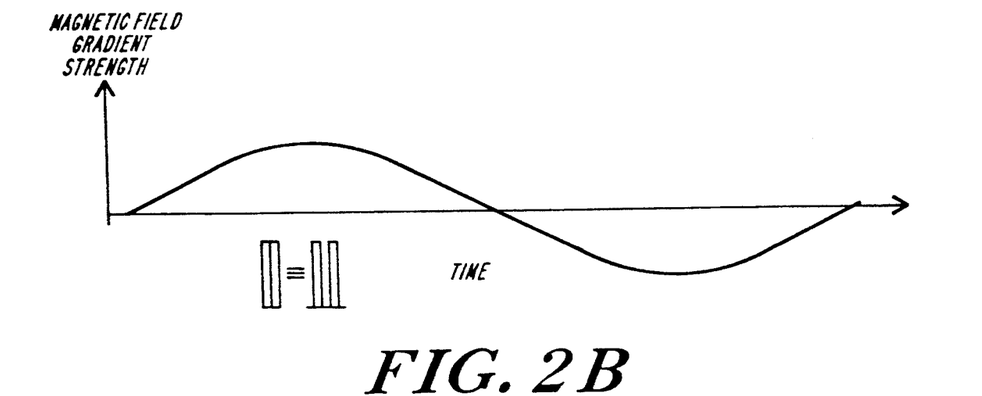
FIG. 2B is a schematic illustration of a magnetic field gradient strength as a function of time for use with the pulse sequence shown in FIG. 2A.

In accordance with the principles of the invention, this multiple-pulse sequence averages to zero homonuclear dipolar couplings as well as time-independent inhomogeneous interactions. As shown in FIG. 2B, the magnetic field gradient strength oscillates with a period equal to the cycle time of the multiple pulse sequence. This time dependence prevents the cycle from averaging the gradient induced spin evolution to zero so that the imaging information is retained. Although, in FIG. 2B, the gradient strength is modulated sinusoidally, it is also possible, without departing from the spirit and scope of the invention, to use modulation approaching a square-wave shape because the shape of the modulation is not critical to the result. With the pulse sequence and gradient as shown in FIGS. 2A and 2B, a phase shift of the RF occurs between solid echo pulse pairs which builds up over the first half of the cycle and then slowly decreases again during the second half. This phase shift

TABLE I

AVERAGE HAMILONIAN CALCULATION FOR A SINGLE 6-PULSE COMPOSITE INVERSION PULSE

| INTERVAL | LENGTH | Iz | Izdτ | IzIz |
|---|---|---|---|---|
| 1 | L − α/2 | Iz | Iz (I − α/2) | IzIz' |
| 2 | α | Iz cosθ + Iy sinθ | [Tz + Tzπ 2α/π] | IzIz'cos²θ + [Izly' +]IyIz'] cosθsinθ + IyIy'sin²θ |
| 3 | z−α | Iy | Iy (I − α) | IyIy' |
| 4 | α | Iy cosθ − Ix sinθ | [Iy − Ix] 2α/π | IyIy'cos²θ − [IxIy + IyIx']cosθsinθ + IxIx'sin²θ |
| 5 | 2τ − α | −Ix | −Ix(2τ − α) | IxIx' |
| 6 | α | −Ix cosθ − Iz sinθ | [−Ix − Iz] 2α/π | IxIx'cos²θ + [IxIz' + IzIs']cosθsinθ + IzIz'sin²θ |
| 7 | τ − α | −Iz | −Iz (τ − α) | IzIz' |
| 8 | α | −Iz cosθ + Iz sinθ | ∂−Iz + Iz] 2α/π | TzTz'cos²θ − [Izly' IyIz']cosθsinθ IOyIy'sin²θ |
| 9 | 2τ − α | Iy | Iy (2i − α) | IyIy' |
| 10 | α | Iy cosθ + Ix sinθ | ∂(Iy + Ix] 2α/π | IyIy'cos²θ + [IyIx' + IxIy']cosθsinθ + IxIx'sin²θ |
| 11 | τ − α | Ix | Ix (τ − α) | IxIx' |
| 12 | α | Ixcoxθ − Iz sinθ | [Ix − Ix] 2α/π | IxIx'cos²θ − [IxIz' + IzIx']cosθsinθ + IzIz'sin²θ |
| 13 | L − α/2 | −Iz | −Iz (I − α/2) | IzIz' |

The aforementioned six-pulse sequence can be used to construct a multi-pulse sequence which eliminates both dipolar coupling and time-independent inhomogeneous broadenings. A complete illustrative 48 pulse sequence constructed in accordance with the invention and consisting of eight composite inversion pulses is shown in FIG. 2A. Each rectangular box in the sequence represents a separate pulse. The letter designations X or Y above each box indicates the RF phase. By convention, the applied fields are referenced to a Cartesian coordinate system with the applied Zeeman field pointing along the Z-axis. The applied RF fields are polarized 90° to the Zeeman field or along the X and Y axes. Since the X and Y axes are arbitrary directional designations, the pulse designations of X and Y are taken to represent relative phases of the RF field. For example a RF pulse designated as an X pulse has a relative phase shift of 90° with respect to an RF pulse designated as a Y pulse. Similarly, an RF pulse designated as X or -X has a relative phase shift of 180° with respect to an X pulse. Thus, the sequence comprises the radio-frequency pulses:

(illustrated schematically as black bars between pulses in FIG. 2A) introduces a spatially homogeneous resonance offset which may be used to shift the center of the image.

As previously mentioned, the zero-order dipolar Hamiltonian vanishes for each composite inversion pulse. The inhomogeneous Hamiltonians are related to the $I_z$ terms as shown in the following equation:

$$H_{cs} = \Sigma \omega_o I_{zi} \quad (9)$$

An expansion of the $I_z$ terms can be made by examining Table 1, columns 3 and 4 for each composite pulse. Considering Table I, column 4, the integrated $I_z$ term is expanded. The Table 1, columns 3 and 4 for each composite pulse. Considering integrals used in obtaining the expressions in Table I, column 4 are as follows:

$$\int_0^a \cos(\pi/2(t'/\alpha))dt' = 2a/\pi \quad (10)$$

and $$\int_0^a \sin(\pi/2(t'/a))dt' = 2a/\pi \quad (11)$$

Table II illustrates the expansion of the zero-order Hamiltonian term including dipolar and inhomogeneous perturbations for the pulse sequence consisting of four, six-pulse composite inversion pulses having the phase shifts specified in the first half of FIG. 2A (terms are developed using the integrals in Table I, columns 3 and 4). From an examination of each row in the table, it can be determined that the zero-order Hamiltonian terms vanish for time intervals 1, 2, 3, 7, 11, 12 and 13.

$$[-I_y - I_x](8\tau - 4a + 16a/\pi)$$

which is equal to:

$$[-I_y - I_x](8\tau + a(16/\pi - 4))$$

which constitutes the effective field for chemical shifts and susceptibility for the first half of the pulse sequence. The pulse phases are arranged so that for the second half of the pulse sequence, the non-zero Hamiltonian terms sum to:

$$[I_y + I_x](8\tau + a(16/\pi - 4))$$

TABLE II

AVERAGE HAMILTONIAN CALCULATION FOR A SINGLE 4-PULSE COMPOSITE INVERSION PULSE

| INTERVAL | PHASE | Izdτ | PHASE | Izdτ | PHASE | Izdτ | PHASE | Izdτ | INTERVAL SUM |
|---|---|---|---|---|---|---|---|---|---|
| | | COMPOSITE PULSE 1 | | COMPOSITE PULSE 2 | | COMPOSITE PULSE 3 | | COMPOSITE PULSE 4 | |
| 1 | | $I_z$ | | $-I_z(\tau - a/2)$ | | $I_z(\tau - a/2)$ | | $-I_z(\tau - a/2)$ | = 0 |
| 2 | X | $(\tau - a/2)$ $[I_z + I_y]$ | Y | $[-I_z + I_x]2a/\pi$ | X | $[I_z + I_y]2a/\pi$ | Y | $[-I_z + I_x]2a/\pi$ | = 0 |
| 3 | | $2a/\pi$ $I_y(\tau - a)$ | | $-I_x(\tau - a)$ | | $-I_y(\tau - a)$ | | $I_x(\tau - a)$ | = 0 |
| 4 | Y | $[I_y - I_x]$ | X | $[-I_x - I_y]2a/\pi$ | Y | $[-I_y - I_x]2a/\pi$ | X | $[I_x - I_y]2a/\pi$ | |
| 5 | | $2a/\pi$ $-I_x$ | | $-I_y(\tau - a)$ | | $-I_x(\tau - a)$ | | $-I_y(\tau - a)$ | |
| 6 | X | $(\tau - a)$ $[-I_x + I_z]$ | Y | $[-I_y + I_z]2a/\pi$ | X | $[-I_x - I_z]2a/\pi$ | Y | $[-I_y - I_z]2a/\pi$ | |
| 7 | | $2a/\pi$ $I_z(\tau - a)$ | | $I_z(\tau - a)$ | | $-I_z(\tau - a)$ | | $-I_z(\tau - a)$ | = 0 |
| 8 | Y | $[I_z - I_y]$ | X/ | $[I_z - I_y]2a/\pi$ | Y | $[-I_z - I_y]2a/\pi$ | X | $[-I_z - I_y]2a/\pi$ | |
| 9 | | $2a/\pi$ $-I_y$ | | $-I_x(2\tau - a)$ | | $-I_y(2\tau - a)$ | | $-I_x(2\tau - a)$ | |
| 10 | X | $(2\tau - a)$ $[-I_y - I_x]$ | Y | $[-I_x - I_y\pi 2a/\pi$ | X | $[-I_y - I_x\pi 2a/\pi$ | Y | $[-I_x - I_y\pi 2a/\pi$ | |
| 11 | | $2a/\pi$ $-I_x$ | | $I_y(\tau - a)$ | | $I_x(\tau - a)$ | | $-I_y(\tau - a)$ | = 0 |
| 12 | Y | $(\tau - a)$ $[-I_x - I_z]$ | X | $[I_y - I_z\pi 2a/\pi$ | Y | $[I_x - I_z\pi 2a/\pi$ | X | $[-I_y - I_z\pi 2a/\pi$ | = 0 |
| 13 | | $2a/\pi$ $-I_z$ $(\tau - a/2)$ | | $I_z(\tau - a/2)$ | | $-I_z(\tau - a/2)$ | | $I_z(\tau - a/2)$ | = 0 |

The terms for the remaining intervals are as follows:

| Interval | Term Value |
|---|---|
| 4 | $[-I_y - I_x] 4a/\pi$ |
| 5 | $[-I_y - I_x] 2(2\tau - a)$ |
| 6 | $[-I_y - I_x] 4a/\pi$ |
| 8 | $[-I_y - I_x] 4a/\pi$ |
| 9 | $[-I_y - I_x] 2(2\tau - a)$ |
| 10 | $[-I_y - I_x] 4a/\pi$ |

Therefore, the sum of the non-zero terms is:

A similar effect is observed for the linear $I_z$ Hamiltonians governing field gradient evolution and phase toggle. However, the Hamiltonian values for field gradient evolution depends on the magnetic field gradient sign while those for the chemical shift and susceptability do not. Thus, when the magnetic field gradient changes sign between the first half of the pulse sequence and the second half of the pulse sequence, the spin evolution sign for the field gradient will also change sign. Consequently, over the entire sequence, the zero-order Hamiltonians will average to zero for dipolar and time-independent inhomogeneous perturbations, but does will not average to zero for the field gradient and phase toggle.

Table III shows for each of the Hamiltonians, the direction of the effective field and the signs of the spin evolution over the first half (24 pulses) and second half (24 pulses) of the multiple-pulse cycle taking into account the change in sign of the magnetic field gradient between the first half of the cycle and the second half.

TABLE III

| Hamiltonian | Effective Field | Sign (first/second half) |
|---|---|---|
| chemical shift | $-I_x - I_y$ | +/− |
| susceptibility | $-I_x - I_y$ | +/− |
| gradient | $-I_x - I_y$ | +/+ |
| phase toggle | $-I_x - I_y$ | +/+ |

From this table, it is clear that the net effect of the chemical shift and susceptibility spin evolution is zero when averaged over the entire pulse sequence, but that both the gradient and phase toggle terms remain.

Further, it is evident that all odd-order average Hamiltonians vanish by symmetry over two consecutive inversion pulses and the second-order dipolar Hamiltonian also vanishes for delta function RF pulses for each inversion pulse since any combination $(XI_xX)$ $(XI_yX)$ $(XI_zX)$ causes the second order dipolar Hamiltonian to vanish (in the aforementioned expressions, the "X" terms represent one of the operators $I_x$, $I_y$ and $I_z$ selected such that the expression in the parentheses represents the spin states of a valid solid echo pulse pair. Examples of the expression $(XI_xX)$ include $(I_yI_xI_z)$, $(I_zI_xI_y)$, etc.).

Figure 3A:
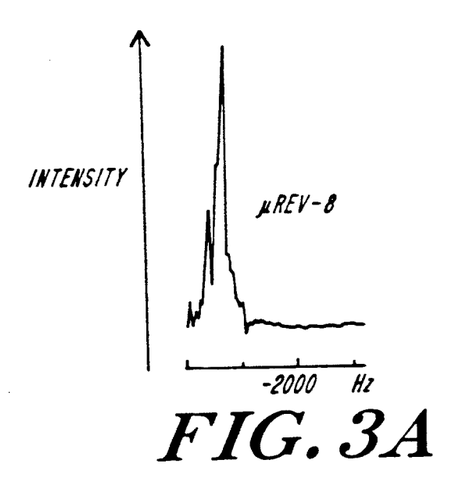
FIG. 3A is an output frequency spectrum plot illustrating the resonance lines resulting from a prior art experiment on the solid para-dimethoxybenzene utilizing a prior art line-narrowing pulse sequence known as MREV-8.
Figure 3B:
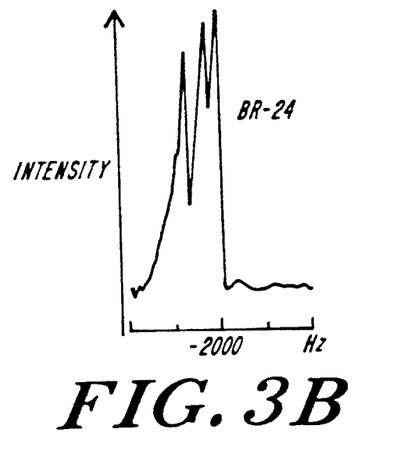
FIG. 3B is an output frequency spectrum plot illustrating the resonance lines resulting from a prior art experiment on the solid para-dimethoxybenzene utilizing a prior art line-narrowing pulse sequence known BR-24.
Figure 3C:
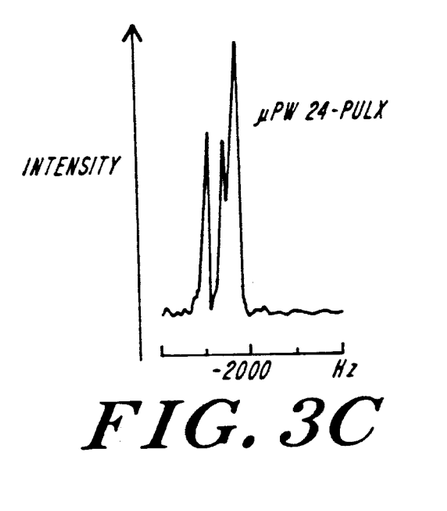
FIG. 3C is an output frequency spectrum plot illustrating the resonance lines resulting from a prior art experiment on the solid para-dimethoxybenzene utilizing an inventive 24 pulse cycle corresponding to the first 24 pulses of the cycle shown on FIG. 2A.

The results of the inventive pulse sequence are readily apparent in FIGS. 3A-3C which are intensity versus frequency spectral plots. The data in these Figures was obtained using the first half of the sequence shown in FIG. 2A. FIGS. 3A-3C show a comparison of the inventive pulse sequence to two commonly employed multiple-pulse cycles for a CRAMPS experiment on para-dimethoxybenzene. In particular, in order to develop the spectrum in FIG. 3A, the multiple pulse sequence commonly known as MREV-8 was used in a conventional NMR spectrometer set up in a known fashion. The MREV-8 pulse sequence is described in detail in articles by P. Mansfield, *Journal of Physical Chemistry*, V. 4, p. 1444 (1971) and W. K. Rhim, D. D. Elleman and R. W. Vaughan, *Journal of Chemical Physics*, v. 58, p. 1772 (1972). Similarly, in order to develop the spectrum in FIG. 3B, the multiple pulse sequence commonly known as BR-24 was used. The BR-24 pulse sequence is described in detail in an article by D. P. Burum and W. K. Rhim, *Journal of Chemical Physics*, v. 71, p. 944 (1979). An examination of the three Figures indicates that the inventive sequence (data shown in FIG. 3C) has superior line-narrowing properties even though the scaling factor is smaller than that for either of the other prior art cycles.

In addition to superior line-narrowing properties, the inventive pulse sequence has additional desirable properties in that it is tolerant of imperfections in RF field homogeneity, pulse imperfections and transmitter misadjustment. For example, the line narrowing improvement of the inventive pulse sequence illustrated in the spectrum shown in FIG. 3C over the conventional BR-24 pulse sequence spectrum shown in FIG. 3B is most likely due to the forgiving nature of the inventive pulse sequence to pulse imperfections.

Further, the composite inversion pulses retain their dipolar decoupling characteristics even if the pulse sequence is run "semi-windowless" (with the time interval $\tau$ in FIG. 1 set to zero). There is no necessary relationship between the lengths of the "short" windows between pulses and the "long" windows between pulse pairs - the pulse sequence can be run semi-windowless without placing any restrictions on the relative lengths of the remaining windows or the pulsewidth. Consequently, the inventive sequence is more forgiving of pulse imperfections; when such imperfections exist the inventive cycle is decidedly better at averaging dipolar coupling than prior art cycles. Further, since the sequence can be run semi-windowless, short cycles can be used with short pulses while still leaving time for the spectrometer probe and receiver to ring down prior to data sampling.

Figure 4:
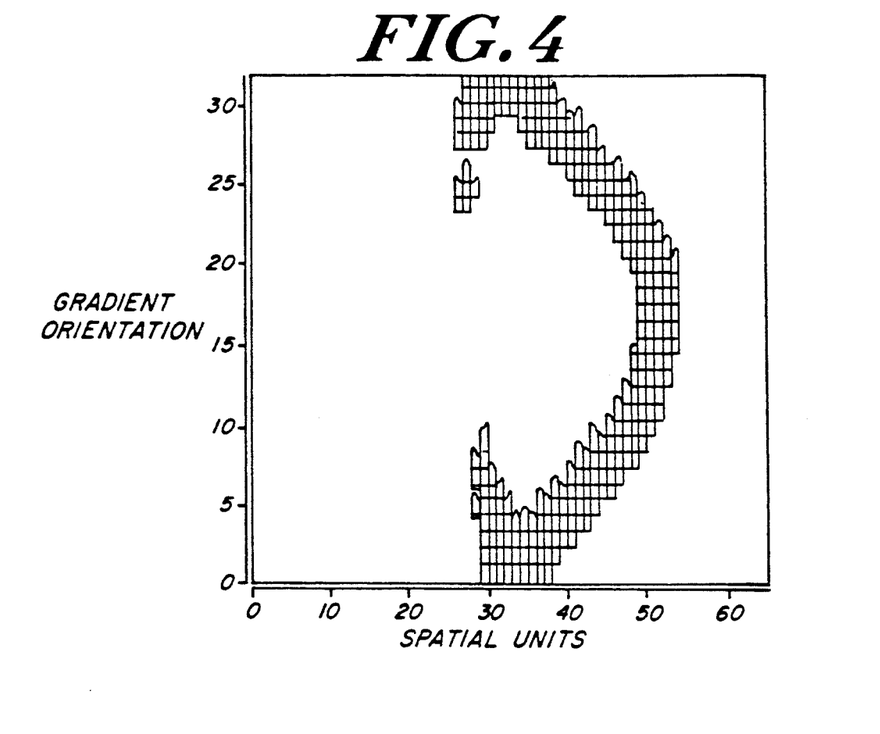
FIG. 4 is a grey-scale plot of data acquired using the illustrative 48-pulse sequence and magnetic field gradient illustrated in FIGS. 2A and 2B of a solid sample consisting of two pieces of adamantane contained in a 2 mm ID tube and placed approximately 3 mm apart.
Figure 5:
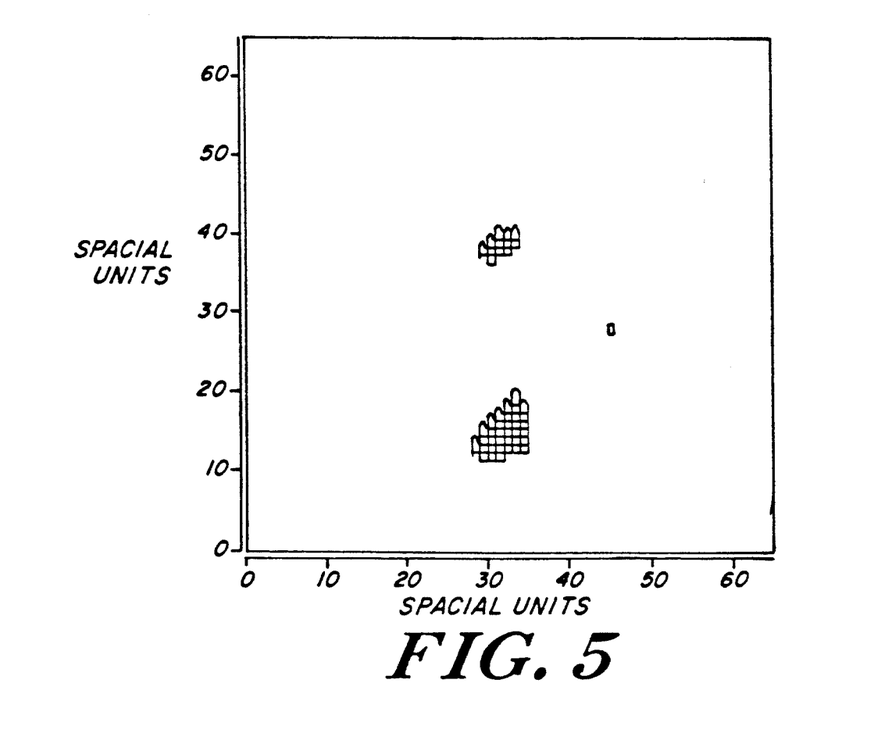
FIG. 5 is an image resulting from a conventional filtered back projection reconstruction of the data shown in FIG. 4.

The image quality resulting from the use of the inventive pulse sequence is shown in FIGS. 4 and 5. These figures illustrate data developed on an MSL-400 NMR spectrometer manufactured by Bruker Instruments, Inc., Fortune Drive, Manning Park, Billerica, Mass. 01821. The sample size was constricted to fit inside a 3 min. i.d. RF coil which was used to obtain high RF field homogeneity. The imaging method used is the pulse sequence and field gradient illustrated in FIGS. 2A and 2B. Multiple experiments were performed using a conventional CRAMPS procedure. Such CRAMPS experiments are discussed in detail in "Advances in Magnetic Resonance", U. Haeberlen, V. 12, suppl. 1, edited by J. S. Waugh, Academic Press (1982) and "Advances in Magnetic Resonance", G. E. Maciel, C. E. Bronnimann and B. L. Hawkins, v. 14, p. 125, edited by W. Warren, Academic Press (1990) which articles are hereby incorporated by reference. Accordingly, the techniques used will not be discussed further herein. Illustratively the output magnetization was sampled once at the end of the sequence and the experiment was repeated to map out the accumulated phase evolution induced by a combination of the gradient and phase offset.

FIG. 4 shows a grey scale gradient orientation vs. spatial position plot of data acquired with the imaging method described above of a sample consisting of two pieces of adamantane contained in a 2 mm i.d. tube and placed approximately 3 mm apart. The data were acquired by varying the direction of the magnetic field gradient electrically between successive acquisitions.

FIG. 5 shows a constructed image resulting from a conventional filtered back projection reconstruction of the data shown in FIG. 4. Filtering was performed in the spatial domain and sharp glitches (one data point wide) were removed by hand prior to deconvolution to avoid large artifacts. Such glitches were the result of spin-locking a small portion of the magnetization along the effective field, and are common in multiple-pulse experiments.

As illustrated in FIGS. 4 and 5, the images of the two pieces of adamantane are well resolved and the image shown in FIG. 5 is a reasonable representation of the actual spin density distribution.

Although only one embodiment of the inventive pulse sequence has been described, several modifications and changes will be immediately apparent to those skilled in the art. For example, the illustrated pulse sequences may be modified in obvious ways to generate new pulse sequences which will perform according to the inventive method. These obvious modifications include utilizing variations of the inversion pulses to construct the pulse sequence. Table IV lists some of the various composite inversion pulses which can be used. In Table IV, the upper line of each six-pulse group represents the phases of the three pulse pairs that comprise the group. The corresponding lower line represents the spin states occurring in the three time intervals between pulses. The place holders A, B and C represent the spin operators, $I_x$, $I_y$ and $I_z$, such that if A is assumed to be $I_x$ then B is either $I_y$ or $I_z$ and C is the remaining operator that is not selected for A or B. The placeholders A, B and C are selected so that the expression ABC is a valid solid echo pulse pair.

TABLE IV

ALTERNATIVE COMPOSITE INVERSION PULSES

| (XY) | (XY) | (XY) | (YX) | (YX) | (YX) |
|---|---|---|---|---|---|
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |
| (XY) | (XY) | (XY) | (YX) | (YX) | (YX) |
| (ABC) | (CAB) | (BCA) | (ACB) | (BAC) | (CBA) |

When any of the listed pulses are used to construct a pulse sequence the following rules should be observed:
(a) the pulse sequence is broken into blocks which each contain at least one composite inversion pulse;
(b) each block has a well-defined effective field that is non-zero and as large as possible;
(c) the effective field for every other block should change sign while remaining along the same direction; and
(d) the sequence must contain an even number of blocks.

These modifications and other obvious changes are intended to be covered by the following claims.

What is claimed is:

1. In an NMR imaging experiment for obtaining spatial spin density data of abundant nuclei in a solid object in which said nuclei are placed in a magnetic field having a spatial gradient and excited with a radio frequency pulse and output magnetization is subsequently detected, a method for improving image resolution comprising the steps of:
A. irradiating said nuclei with at least one radio-frequency pulse sequence after said nuclei are excited and before said output magnetization is detected, said pulse sequence being composed of at least two radio-frequency composite inversion pulses, each of said composite inversion pulses having a predetermined non-zero effective field in the same direction and wherein the sign of the effective field in the first pulse is different from the sign of the effective field in the second pulse; and
B. varying the strength of said magnetic field gradient during step A.

2. In an NMR imaging experiment for obtaining spatial spin density data of abundant nuclei in a solid object, the method according to claim 1 wherein said at least one radio-frequency pulse sequence used to irradiate said nuclei in step A comprises at least four composite inversion pulses, each of said composite inversion pulses comprising three standard solid echo radio-frequency pulse pairs so that said at least one radio-frequency pulse sequence comprises at least twelve standard solid echo radio-frequency pulse pairs.

3. In an NMR imaging experiment for obtaining spatial spin density data of abundant nuclei in a solid object, the method according to claim 2 wherein in step A1 the pulse sequence comprises the radio-frequency pulses:

X, Y, −X, Y, X, Y, −Y, −X, −Y, X, −Y, −X, −X, −Y
+X, −Y, −X, −Y, +Y, X, Y, −X, +Y, X where the phase of an X pulse differs from the phase of a Y pulse by 90° and the phase of an X pulse differs from the phase of a −X pulse by 180°.

4. In an NMR imaging experiment for obtaining spatial spin density data of abundant nuclei in a solid object, the method according to claim 1 wherein said at least one radio-frequency pulse sequence used to irradiate said nuclei in step A comprises
at least eight composite inversion pulses, each of said composite inversion pulses comprising three standard solid echo radio-frequency pulse pairs so that said at least one radio-frequency pulse sequence comprises at least twenty-four standard solid echo radio-frequency pulse pairs.

5. In an NMR imaging experiment for obtaining spatial spin density data of abundant nuclei in a solid object, the method according to claim 4 wherein in step A2 the pulse sequence comprises the radio-frequency pulses:

X, Y, −X, Y, X, Y, −Y, −X, −Y, X, −Y, −X, −X, Y,
−X, −Y, −X, Y, −Y, X, Y, X, −Y, X, −X, −Y, X, −Y,
−X, −Y, Y, X, Y, −X, Y, X, X, −Y, X, Y, X, −Y, Y,
−X, −Y, −X, Y, −X where the phase of an X pulse differs from the phase of a Y pulse by 90° and the phase of an X pulse differs from the phase of a -X pulse by 180°.

6. In an NMR imaging experiment for obtaining spatial spin density data of abundant nuclei in a solid object, the method according to claim 1 wherein step B comprises the step of:
B1. varying the strength of said magnetic field gradient during step A so that said magnetic field gradient has a first sign during a first of said composite inversion pulses and a second sign opposite to said first sign during a second of said composite inversion pulses.

7. In an NMR imaging experiment for obtaining spatial spin density data of abundant nuclei in a solid object, the method according to claim 1 wherein step B comprises the step of:
B2. varying the strength of said magnetic field gradient periodically during step A so that the period of said magnetic field gradient has the same time duration as the radio frequency pulse sequence of step A.

8. In an NMR imaging experiment for obtaining spatial spin density data of abundant nuclei in a solid object, the method according to claim 1 further comprising the step of:
C. processing said output magnetization signal to obtain a spatial spin density image of said object.

9. In an NMR imaging experiment for obtaining spatial spin density data of abundant nuclei in a solid object, the method according to claim 1 further comprising the step of:

D. physically inclining said object along an axis at an angle of substantially 54°44' to said magnetic field and physically spinning said object about said axis.

10. In an NMR imaging experiment for obtaining spatial spin density data of abundant nuclei in a solid object, the method according to claim 1 wherein said at least one radio-frequency pulse sequence used to irradiate said nuclei in step A is a semi-windowless pulse sequence composed of at least four composite inversion pulses, each of said composite inversion pulses comprising three standard solid echo radio-frequency pulse pairs so that said at least one radio-frequency pulse sequence comprises at least twelve standard solid echo radio-frequency pulse pairs.

11. In an NMR imaging experiment for obtaining spatial spin density data of abundant nuclei in a solid object, the method according to claim 10 wherein said at least one radio-frequency semi-windowless pulse sequence used to irradiate said nuclei in step A comprises
at least eight composite inversion pulses, each of said composite inversion pulses comprising three standard solid echo radio-frequency pulse pairs so that said at least one radio-frequency pulse sequence comprises at least twenty-four standard solid echo radio-frequency pulse pairs.

12. An NMR imaging method for obtaining spatial spin density data of abundant nuclei in a solid object, said method comprising the steps of:

A. placing said nuclei in a magnetic field having a spatial gradient;

B. exciting said nuclei with a radio frequency pulse;

C. irradiating said nuclei with at least one radio-frequency pulse sequence composed of at least two radio-frequency composite inversion pulses, each of said composite inversion pulses having a predetermined non-zero effective field in the same direction and wherein the sign of the effective field in the first pulse is different from the sign of the effective field in the second pulse;

D. varying the strength of said magnetic field gradient during step C; and

E. detecting output magnetization.

13. An NMR imaging method according to claim 12 wherein said at least one radio-frequency pulse sequence used to irradiate said nuclei in step C comprises
at least four composite inversion pulses, each of said composite inversion pulses comprising three standard solid echo radio-frequency pulse pairs so that said at least one radio-frequency pulse sequence comprises at least twelve standard solid echo radio-frequency pulse pairs.

14. An NMR imaging method according to claim 13 wherein in step C1, the pulse sequence comprises the radio-frequency pulses:

$$X, Y, -X, Y, X, Y, -Y, -X, -Y, X, -Y, -X, -X, -Y$$
$$+X, -Y, -X, -Y, +Y, X, Y, -X, +Y, X$$

where the phase of an X pulse differs from the phase of a Y pulse by 90° and the phase of an X pulse differs from the phase of a $-X$ pulse by 180°.

15. An NMR imaging method according to claim 12 wherein said at least one radio-frequency pulse sequence used to irradiate said nuclei in step C comprises
at least eight composite inversion pulses, each of said composite inversion pulses comprising three standard solid echo radio-frequency pulse pairs so that said at least one radio-frequency pulse sequence comprises at least twenty-four standard solid echo radio-frequency pulse pairs.

16. An NMR imaging method according to claim 15 wherein in step C2 the pulse sequence comprises the radio-frequency pulses:

$$X, Y, -X, Y, X, Y, -Y, -X, -Y, X, -Y, -X, -X, Y,$$
$$-X, -Y, -X, Y, -Y, X, Y, X, -Y, X, -X, -Y, X, -Y,$$
$$-X, -Y, Y, X, Y, -X, Y, X, X, -Y, X, Y, X, -Y, Y,$$
$$-X, -Y, -X, Y, -X$$

where the phase of an X pulse differs from the phase of a Y pulse by 90° and the phase of an X pulse differs from the phase of a $-X$ pulse by 180°.

17. An NMR imaging method according to claim 12 wherein step D comprises the step of:

D1. varying the strength of said magnetic field gradient periodically during step C so that the period of said magnetic field gradient has the same time duration as the radio frequency pulse sequence of step C.

18. An NMR imaging method according to claim 12 wherein step D comprises the step of:

D2. varying the strength of said magnetic field gradient during step A so that said magnetic field gradient has a first sign during a first of said composite inversion pulses and a second sign opposite to said first sign during a second of said composite inversion pulses.

19. An NMR imaging method according to claim 12 further comprising the step of:

F. processing said output magnetization signal to obtain a spatial spin density image of said object.

20. An NMR imaging method according to claim 12 further comprising the step of:

G. physically inclining said object along an axis at an angle of substantially 54° 44' to said magnetic field and physically spinning said object about said axis.

* * * * *